United States Patent [19]

Adams et al.

[11] Patent Number: 4,812,990

[45] Date of Patent: Mar. 14, 1989

[54] SYSTEM AND METHOD FOR OPTIMIZING AIRCRAFT FLIGHT PATH

[75] Inventors: Daniel R. Adams, Richardson; Richard E. McKenzie, Arlington, both of Tex.

[73] Assignee: Merit Technology Incorporated, Plano, Tex.

[21] Appl. No.: 44,059

[22] Filed: Apr. 29, 1987

[51] Int. Cl.$^4$ .............................................. G06F 15/50
[52] U.S. Cl. .................................... 364/444; 364/461
[58] Field of Search ............... 364/433, 448, 424, 447, 364/427, 428, 460, 461, 443, 439, 442, 444; 342/29

[56] References Cited

U.S. PATENT DOCUMENTS

| | | | |
|---|---|---|---|
| 4,063,073 | 12/1977 | Strayer | 364/439 |
| 4,104,512 | 8/1978 | Strayer | 364/439 |
| 4,144,571 | 3/1979 | Webber | 364/450 |
| 4,312,041 | 1/1982 | De Jonge | 364/442 |
| 4,325,123 | 4/1982 | Graham et al. | 364/442 |
| 4,646,244 | 2/1987 | Bateman et al. | 364/461 |
| 4,675,823 | 6/1987 | Noland | 364/460 |
| 4,706,198 | 11/1987 | Tharman | 364/439 |

OTHER PUBLICATIONS

Barney, "Enhanced Terrain Masked Penetration Program", National Aerospace & Electronics Conference, 1984.
Wall, Jr. et al., "Advance Automatic Terrain Following/Terrain Avoidance Control Concepts-Algorithm Development", National Aerospace and Electronic Conference, 1981.
Chan et al., "Real Time Optimal Flight Path Generation by Storage of Massive Data Bases", National Aerospace and Electronics Conference, 1985.

Primary Examiner—Parshotam S. Lall
Assistant Examiner—Thomas G. Black
Attorney, Agent, or Firm—W. Kirk McCord

[57] ABSTRACT

A system and method for determining the optimal path for an aircraft to fly from a first position to a second position so that the aircraft heading at the second position is within preselected minimum and maximum heading limits. A two-dimensional reference grid is constructed so that the first position is in the center cell of the first rank of the grid and the second position is adjacent to the center cell of the last rank thereof. Dynamic programming techniques are used to determine the possible flight paths between the first and second positions and to select the path of minimum cost as the optimal path. The possible flight paths are constructed by identifying the possible connections between the last rank and the second postion and then between each pair of adjacent ranks, working backward from the last rank to the first position, which is located in the first rank. A possible connection is deemed to exist when the aircraft can fly from one point to a target point (e.g., between specified cells in adjacent ranks) and arrive at the target point within particular heading limits without exceeding the predetermined maximum lateral acceleration of the aircraft. Corresponding heading limits are determined for each "connected" cell in the grid, so that all possible flight paths are examined, consistent with the preselected heading limits at the second position (e.g., the target area) and the maximum lateral acceleration allowed for the aircraft.

10 Claims, 12 Drawing Sheets

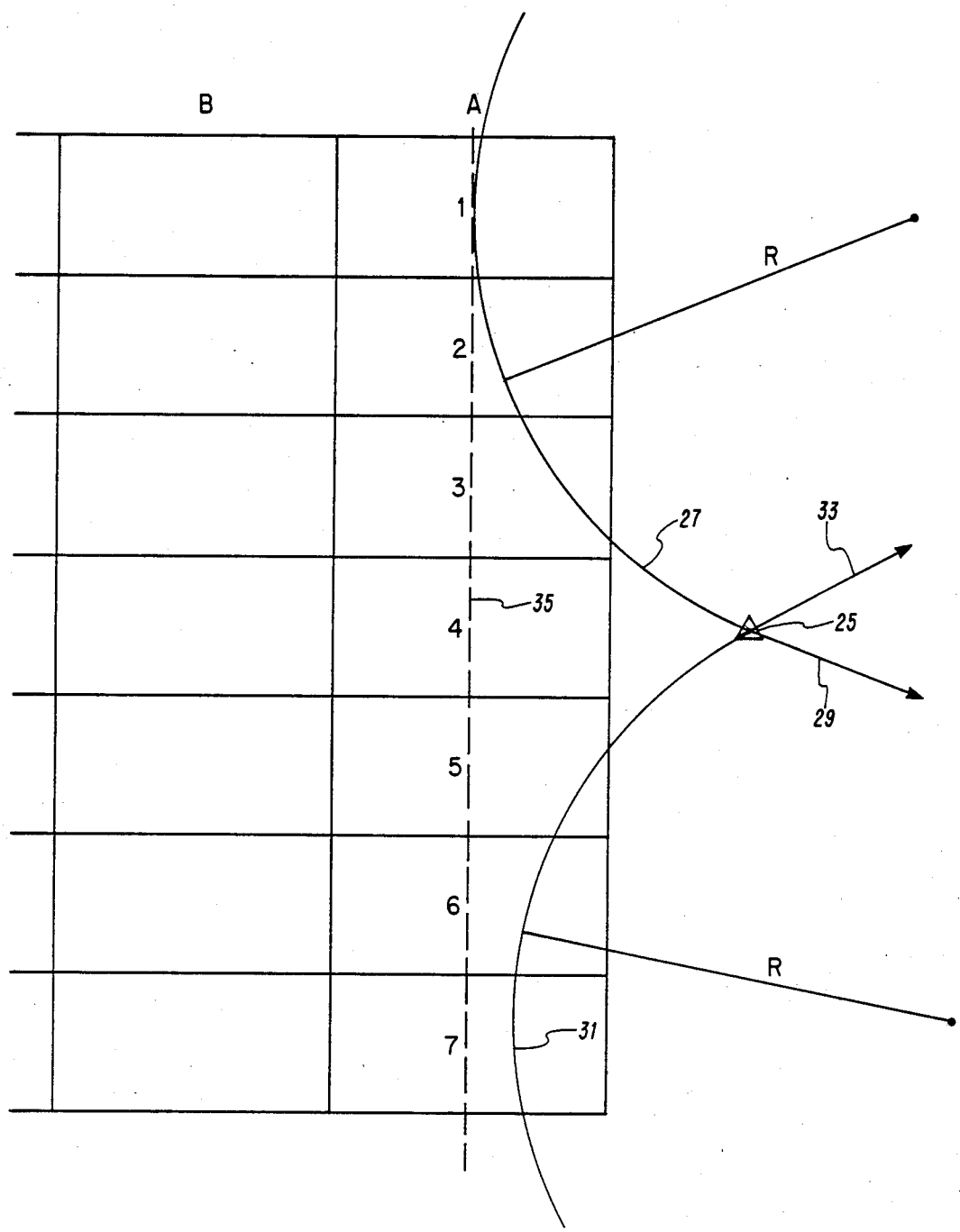
FIG. 3
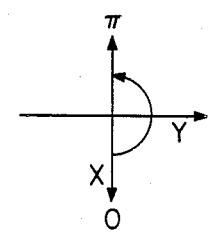

SHEET 1

SHEET 2

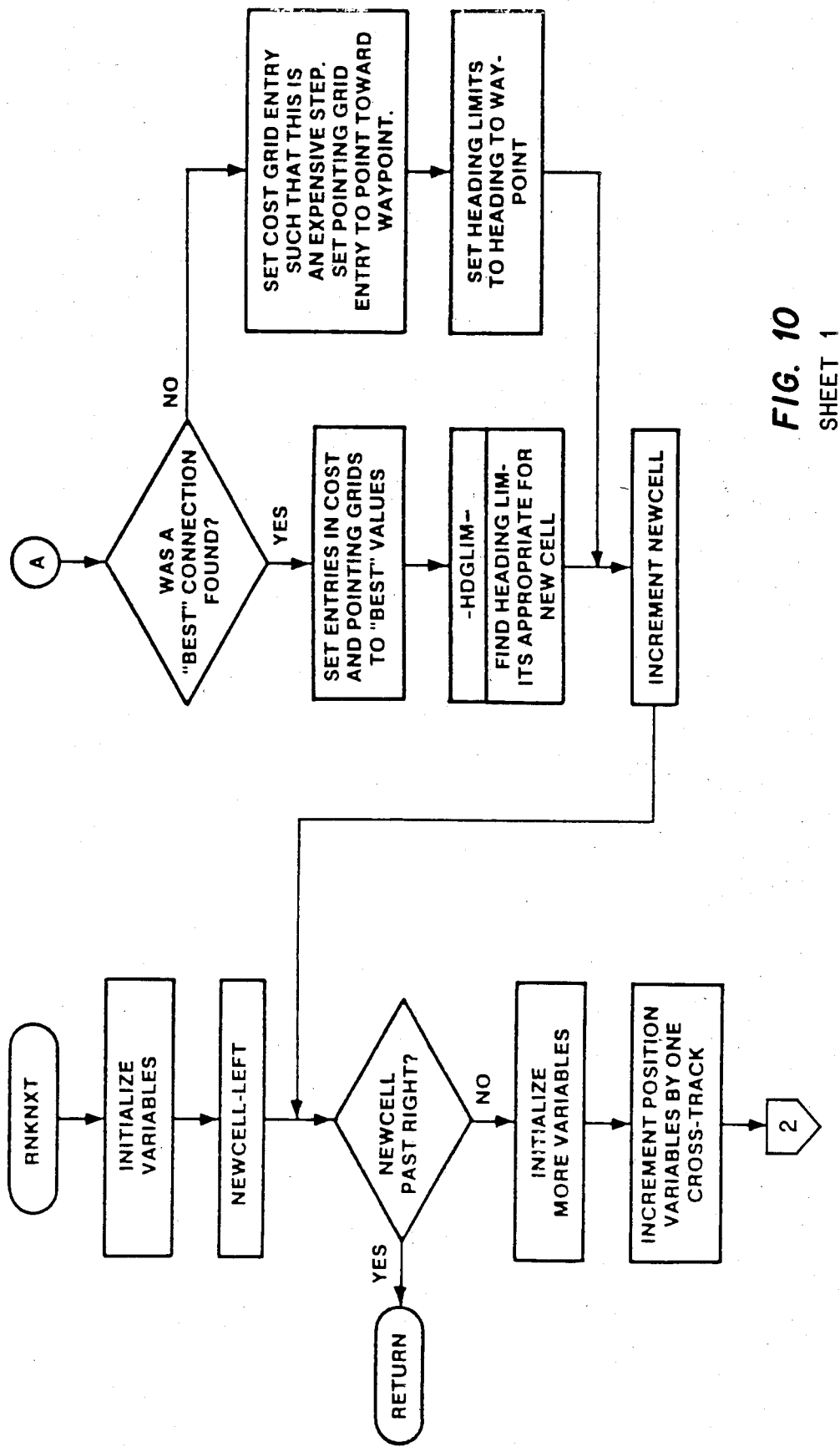
FIG. 10 SHEET 1

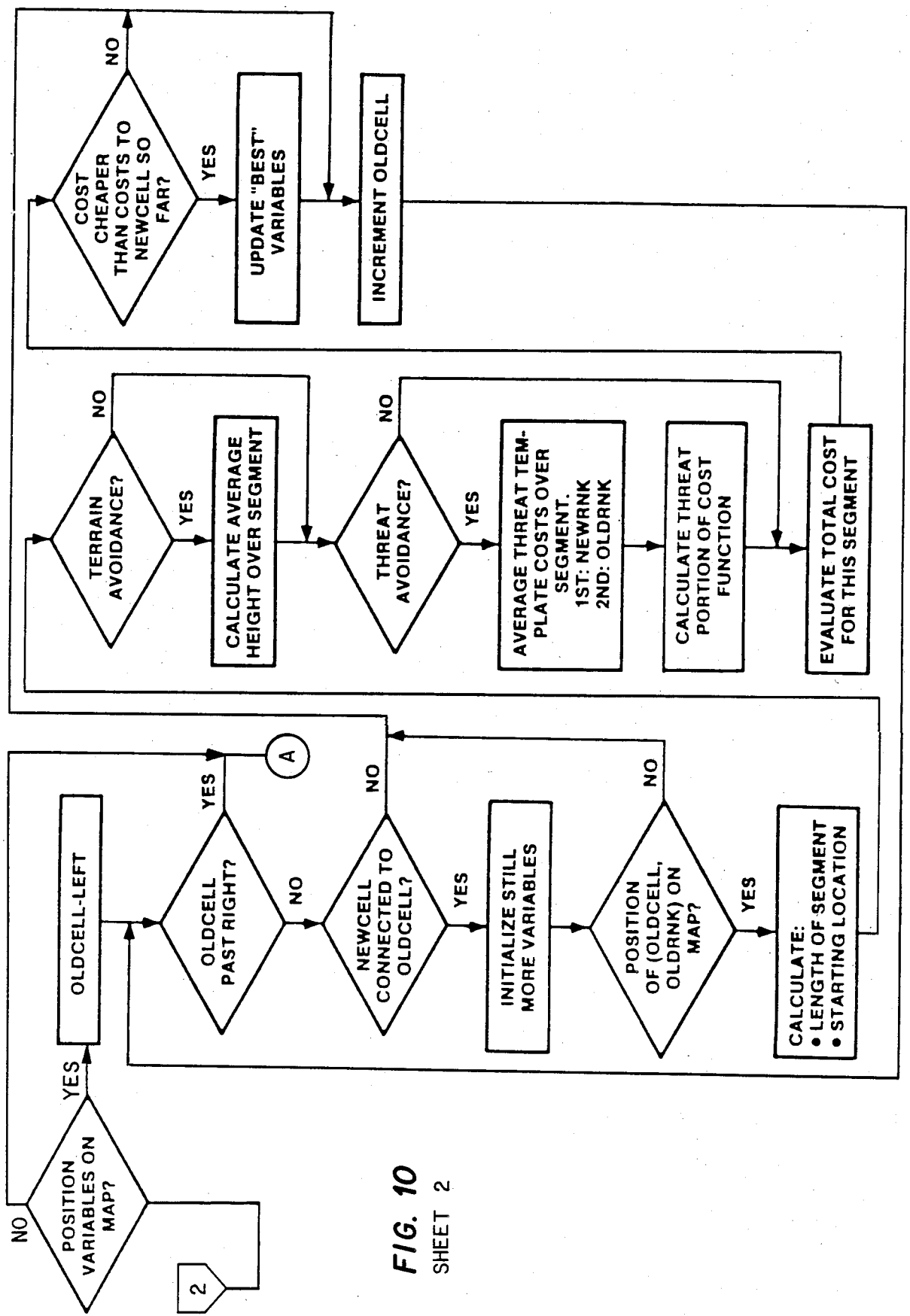
FIG. 10 SHEET 2

SHEET 1

SHEET 2

SHEET 3

SYSTEM AND METHOD FOR OPTIMIZING AIRCRAFT FLIGHT PATH

FIELD OF THE INVENTION

The present invention relates generally to terrain avoidance systems for aircraft and in particular to a system and method for optimizing the flight path of an aircraft using dynamic programming techniques.

BACKGROUND OF THE INVENTION

When a military aircraft is assigned a mission in enemy territory, the selection of a flight path by which the aircraft can penetrate into and escape from the enemy territory is of critical concern. The selection of an optimal path is based upon a number of factors, including the terrain, the location of enemy threats, aircraft handling characteristics and other capabilities of the aircraft, ride quality and fuel and time constraints. An anticipated optimal flight path can be computed prior to the mission, but as the mission develops new situations may occur and new information become available along the route which may alter the optimal path. For example, "pop-up" threats may occur along the route and the aircraft may have to divert into uncharted territory where it may encounter previously unknown obstacles.

DESCRIPTION OF THE PRIOR ART

According to prior practice, the traditional approach is for the aircraft to perform the necessary maneuvers to avoid unanticipated enemy threats and other obstacles, such as uncharted mountains and then to rejoin the anticipated optimal path computed prior to the commencement to the mission. A major disadvantage of this approach is that if the aircraft is forced to divert a large distance off the pre-planned route, it may be unduly burdensome from a cost standpoint, considering all factors, for the aircraft to attempt to rejoin the pre-planned route. For example, rejoining the pre-planned route after a substantial diversion may entail the aircraft flying over dangerous terrain or over territory where the survivability of the aircraft is greatly reduced due to enemy threats. Furthermore, attempting to rejoin the original route may be unacceptable in terms of substantially increased time to complete the mission and increased fuel consumption.

More recent approaches have focused on computing the optimal flight path on a real-time basis, taking into consideration the then current position of the aircraft and the current situation. This approach uses the power of the computer on board the aircraft to continually update the optimal flight path at any given time during the flight based on the then current position of the aircraft.

One such approach is typified by the Enhanced Terrain Masked Penetration Program (ETMPP), developed and sold by Texas Instruments Incorporated. This algorithm divides the territory between the position of the aircraft at any given time and the target point, or a "way point" through which the aircraft will fly on the way to the target, into an infield region immediately ahead of the aircraft and an outfield region from the outer boundary of the infield to the target or way point. A "tree growth" algorithm is used to compute the possible paths to the outer boundary of the infield and standard dynamic programming techniques are used to compute the possible paths from the outer boundary of the infield to the target or way point. In the infield, the lateral motion of the aircraft is constrained within predetermined limits left or right with respect to a straight heading to the target and in the outfield the dynamic programming is used to determine the possible flight paths for five different headings from each possible position of the aircraft.

One of the disadvantages of ETMPP is that the lateral motion and heading of the aircraft is artificially constained within preselected heading limits. Another disadvantage is that dynamic programming is performed five different times at each stage in the outfield to determine possible routes to the target, which substantially increases the number of programming calculations and hence the execution time of the program.

The ETMPP is described in greater detail in the enclosed paper entitled "Enhanced Terrain Masked Penetration Program" by George M. Barney, presented at the National Aerospace and Electronics Conference, 1984.

Another approach to the problem of determining optimal flight path real-time is the so-called "feasible directions" algorithm. In contrast to dynamic programming wherein the optimal path is computed "backwards" from the target to the current aircraft position, the "feasible directions" algorithm computes the optimal path beginning at the then current position of the aircraft and looking ahead a predetermined distance. In this manner the optimal flight path immediately ahead of the aircraft is computed without taking into account the "global" picture farther downrange. Thus, the aircraft may be forced to fly through areas where the flight cost is unacceptably high in terms of all the factors described above because the previously computed short range paths have led the aircraft into a region from which there is no escape without flying a relatively high cost route. The "feasible directions" approach is described in the enclosed paper entitled "Advance Automatic Terrain Following/Terrain Avoidance Control Concepts—Algorithm Development", by J. E. Wall, Jr. et al, presented at the National Aerospace and Electronics Conference, 1981.

Yet another algorithm is described in the enclosed paper entitled "Real Time Optimal Flight Path Generation by Storage of Massive Data Bases" by Y. K. Chan et al, presented at the National Aerospace and Electronics Conference, 1985. This algorithm uses dynamic programming to compute optimal flight path of an aircraft on a real-time basis during the flight. The territory between the target or way point and the then current aircraft position is superimposed on a two-dimensional reference grid, the length of which is the distance between the then current aircraft position and the target or way point (i.e., the "along-track" direction) and the width of which is a predetermined grid corridor beyond which the aircraft cannot venture on its way to the target or way point (i.e., the "cross-track" direction). The aircraft is constrained in its lateral manuevering so that the aircraft heading deviates no more than 45 degrees from the straight heading to the target or way point, (i.e., the along-track direction). Although this algorithm is relatively fast compared with many prior art algorithms, many possible paths to the target (which may include the overall optimal path) are ignored because of the artifical constraints imposed by the 45 degree heading limitation.

The need therefore exists in the art for a system and method to determine and update on a real-time basis the optimal flight path for an aircraft, wherein substantially all reasonable flight paths are examined within a reasonable period of time.

OBJECTS OF THE INVENTION

It is, therefore, the principal object of the present invention to provide an improved system and method for determining and updating on a real-time basis optimal aircraft flight path.

It is another object of the invention to provide a system and method for determining optimal aircraft flight path in which substantially all reasonable flight paths are taken into consideration.

It is yet another object of the invention to provide a method for determining and updating on a real-time basis optimal aircraft flight path, using dynamic programming techniques without imposing artificial constraints on aircraft heading and maneuvering.

It is still another object of the invention to provide a system and method for determining optimal aircraft flight path for selected aircraft heading constraints at the target or way point.

SUMMARY OF THE INVENTION

These and other objects are accomplished in accordance with the present invention wherein a system and method are provided for determining an optimal path for an aircraft to fly from a first position to a second position so that the aircraft heading at the second position is within preselected minimum and maximum heading limits. A reference grid is constructed having a length which is oriented along a first axis connecting the first and second positions so that the first axis corresponds to the center line of the grid and a width which corresponds to a preselected width along a second axis which is perpendicular to the first axis. The grid is divided into N number of ranks in succession between the first and second positions. The first position is at the center of the first rank and the second position is adjacent to the center of the Nth rank. Each rank is divided into a predetermined number of rectangular cells.

Those cells in the Nth rank from which the aircraft can reach the second position within the preselected minimum and maximum heading limits without exceeding the maximum lateral acceleration allowed for the aircraft are "connected" cells. The cost of flying from each of the connected cells in the Nth rank to the second position is computed based on a preselected cost function. Corresponding minimum and maximum heading limits at each of the connected cells in the Nth rank are determined. The corresponding minimum and maximum heading limits represent a range of allowed headings for the aircraft at the corresponding connected cell which will enable the aircraft to reach the second position within the preselected minimum and maximum heading limits without exceeding the maximum lateral acceleration.

After the connected cells in the Nth rank are determined, the respective connected cells in each of the other ranks are determined in sequence beginning with the (N−1)th rank and ending with the second rank. This is accomplished by determining the respective connected paths between each pair of adjacent ranks (i−1) and i. Each of the connected paths represents a discrete connection between a specified cell in the (i−1)th rank and the specified connected cell in the ith rank whereby the aircraft can reach the specified cell in the ith rank within the corresponding heading limits from the specified cell in the (i−1)th rank without exceeding the maximum lateral acceleration. Each of the cells in the (i−1)th rank from which the aircraft can reach at least one of the connected cells in the ith rank within the corresponding heading limits without exceeding the maximum lateral acceleration is deemed to be a "connected" cell in the (i−1)th rank.

After the connected cells in the (i−1)th rank are determined, the cost of flying along each of the connected paths between the (i−1) rank and the ith rank is computed. The minimum cost of flying from each of the connected cells in the (i−1)th rank all the way to the second position and the corresponding minimum cost path are stored. The corresponding minimum and maximum heading limits for each of the connected cells in the (i−1)th rank are then determined. The corresponding heading limits represent a range of allowed headings for the aircraft at the corresponding connected cell in the (i−1)th rank which will enable the aircraft to reach a particular one of the connected cells in the ith rank within the corresponding heading limits for that particular connected cell in the ith rank without exceeding the maximum lateral acceleration. The particular connected cell in the ith rank is that cell which lies on the path of minimum cost between the corresponding connected cell in the (i−1)th rank and the second position.

After the connected cells and the corresponding minimum and maximum heading limits for each of the connected cells are determined, the particular ones of the connected cells in the second rank which the aircraft can reach from the first position within the corresponding heading limits without exceeding the maximum lateral acceleration are identified. The cost of flying from the first position to each of the aforementioned connected cells in the second rank is computed based on the cost function and the path of minimum cost of flying from the first position to the second position is determined based on the cumulative cost of all of the possible connected paths. The minimum cost path between the first and second positions is the optimal flight path for the aircraft. The particular connected cell in the second rank which lies on the path of minimum cost between the first and second positions is used as a target point for determining the corresponding minimum and maximum heading limits for the aircraft at the first position. Working backwards using dynamic programming techniques, the corresponding minimum and maximum heading limits at the first position can be used as the reference heading limits for determining the optimal flight path between another position uprange from the first position and the first position so that the optimal aircraft flight path can be determined between any pair of adjacent way points beginning with the then current position of the aircraft and extending all the way to the ultimate target.

BRIEF DESCRIPTION OF THE DRAWINGS

Other objects and advantages of the invention will be apparent from the detailed description and claims when read in conjunction with the accompanying drawings wherein:

FIG. 3 illustrates the determination of the possible grid positions from which the aircraft can reach the target or way point within the preselected aircraft heading constraints, according to the present invention;

FIGS. 5A, 5B and 6–11 are flow diagrams illustrating the method by which the optimal aircraft flight path is determined in accordance with the present invention.

DETAILED DESCRIPTION OF THE PREFERRED EMBODIMENT

In the description which follows, like parts are marked throughout the specifications and the drawings, respectively. The drawings are not necessarily to scale and in some instances proportions have been exaggerated in order to more clearly depict certain features of the invention.

Figure 1:
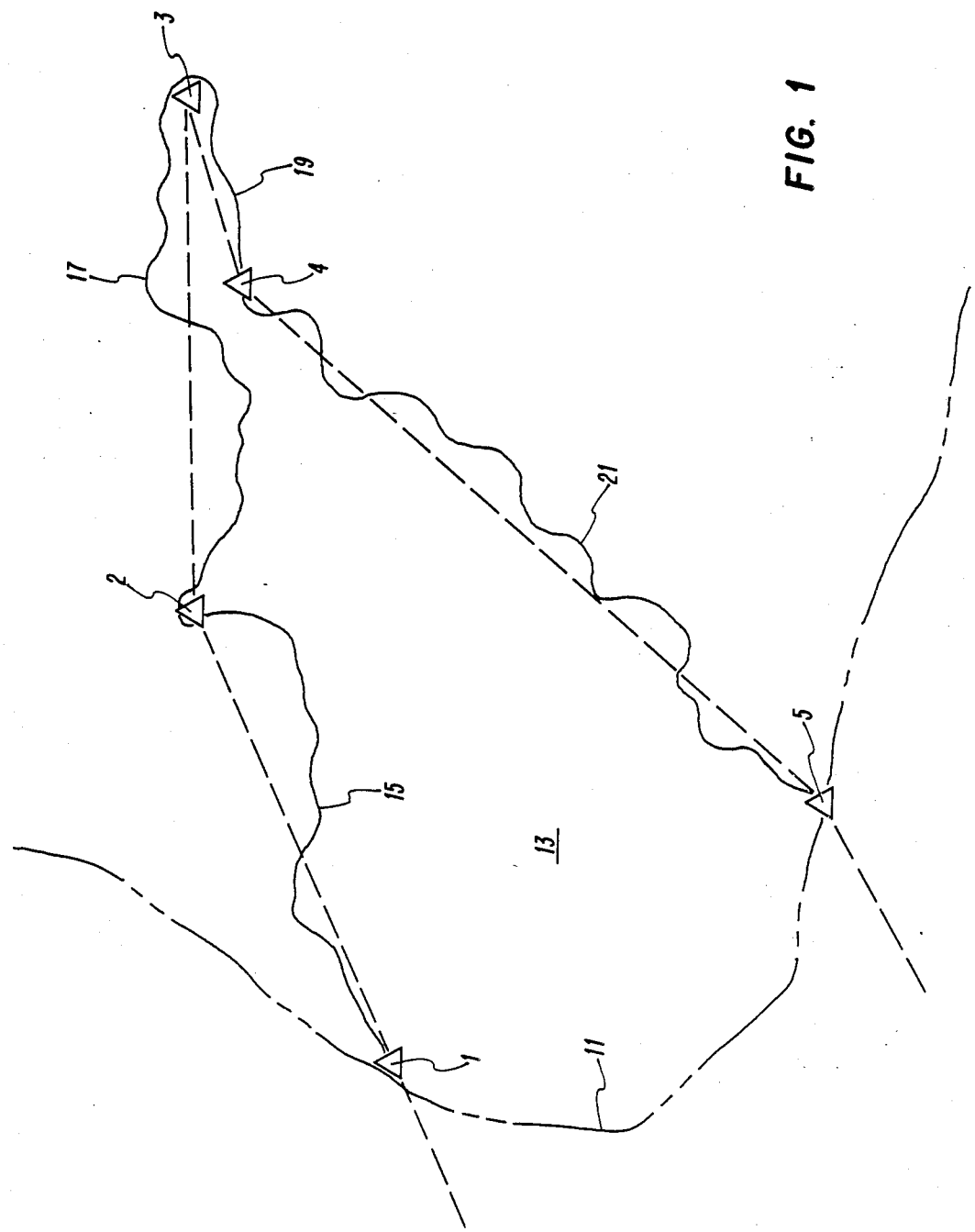
FIG. 1 shows a typical aircraft flight path through selected way points on the way to a target area and the return flight path from the target area in accordance with the present invention.

Referring to FIG. 1, the flight path of a military aircraft on a mission in enemy territory is illustrated. When the aircraft crosses boundary 11 into enemy territory 13, the pilot will want to fly an optimal path in terms of minimizing the overall cost of the mission. The cost takes into account the terrain elevation, the location of enemy ground threats, the cost of deviating from the straight line path and the cumulative distance to the target area from any point along the path as well as other factors in determining the overall cost of a particular flight path.

Points 1, 2, 3, 4 and 5 represent the actual positions through which the aircraft will fly during the mission. The actual path that the aircraft will fly between these points is that path which yields the minimum cost to fly the aircraft from one point to the next. The optimal path is determined in accordance with the present invention using dynamic programming techniques, as will be described in greater detail hereinafter.

The aircraft enters enemy territory 13 at point 1 and flies a serpentine path 15 between points 1 and 2. The target area is at point 3. One skilled in the art will note that the aircraft flies a different path 17 between point 2 and point 3 to the target area. After completing the mission, the aircraft flies a third path 19 between point 3 and point 4 and a fourth path 21 between point 4 and point 5. The optimal flight path is continually updated on a real-time basis during flight to determine the optimal flight path from the then current position of the aircraft to the next point through which the aircraft must fly. Points 1, 2, 4 and 5 are commonly referred to as "way points" and point 3 is commonly referred to as the "target area" or "destination point".

Figure 2:
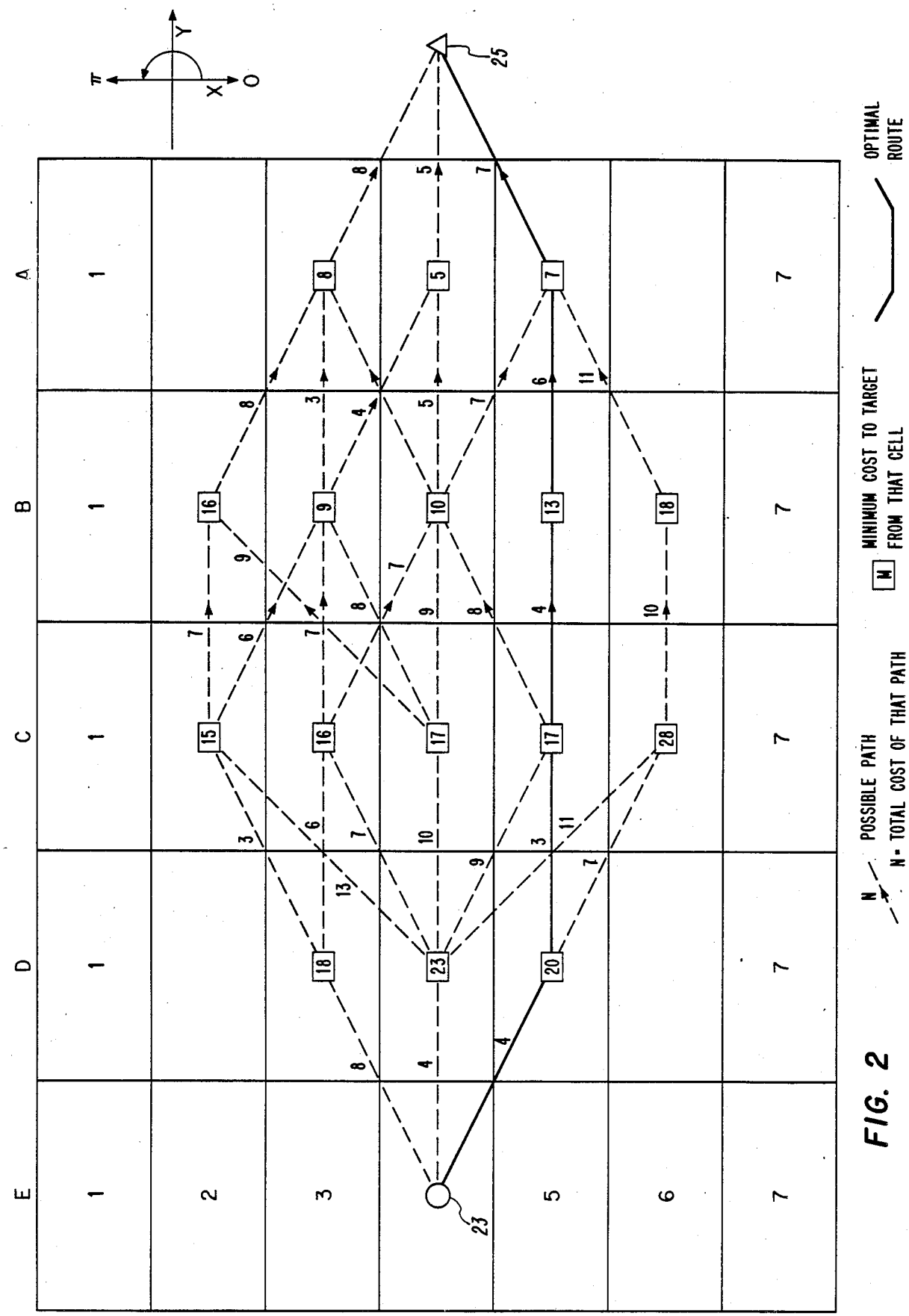
FIG. 2 is a grid diagram illustrating the determination of the optimal aircraft flight path to the target or way point as a function of the minimum cost to complete the route, according to the present invention.

By way of example, FIG. 2 illustrates the determination of the optimal flight path of the aircraft as a function of the total cost to fly between selected points. The optimal flight path is determined by computer on board the aircraft using dynamic programming techniques in accordance with the present invention. The region between adjacent way points is divided into a two dimensional Cartesian grid system. The straight line axis connecting a first point (shown on the left in FIG. 2) with a second point downrange (shown on the right in FIGURE 2) is the Y-axis and the direction is referred to as "along track". The axis perpendicular to the Y-axis is the X-axis and the direction along the X-axis is referred to as "cross track". The length of the grid along track is substantially equal to the distance between the first and second points and the width of the grid across track is a predetermined width. Typically, the width of the grid, which is referred to as the "corridor width", is less than or equal to the length of the grid along track. The grid axes are not necessarily oriented in a North-South or East-West direction.

The grid consists of a plurality of successive regions extending across the entire corridor width, which are referred to as "ranks". Within each rank are a plurality of rectangular "cells". Each rank preferably has M number of cells, where M is an odd integer, so that the center of each rank is at the center of the middle cell thereof. The ranks are designated by the letters A, B, C, D and E in order from the last rank just before reaching the second way point to the first rank in which the aircraft is located at a particular time. The individual cells within each rank are designated with the letter of the rank and the cell number within each rank as shown in FIG. 2. For example, cell E1 is at the upper left corner of the grid and cell A7 is at the lower right corner of the grid. The first point is in the center cell (E4) of the first rank and the second point is just outside the center cell (A4) of the last rank.

Dynamic programming is used to compute the optimal path between first and second points 23 and 25 in accordance with the present invention. The heading limitations of the aircraft at second point 25 are either pre-stored in the on-board computer or entered into the computer by the pilot during the mission. The heading limitations specify the minimum and maximum headings of the aircraft at second point 25, as measured from the X-axis as shown, with "0" being the smallest possible heading and "$\pi$" being the largest possible maximum heading so that no component of the aircraft heading is directed away from second point 25. Based on the aircraft speed and maximum lateral acceleration, the computer determines from which cells in rank A the aircraft could reach second point 25 within the prescribed heading limits and computes the cost to arrive at second point 25 from each of the "connected" cells in rank A. The process by which the connected cells are determined is described in greater detail hereinafter with reference to FIGS. 3, 4, 7 and 9.

For example, FIG. 2 shows that the aircraft can reach second point 25 from cell A3, A4 or A5. The possible paths from these cells to second point 25 are represented by the corresponding dotted lines. The cost to reach the target area is computed by summing the individual cost components as follows:

Total Cost=Terrain Cost+Threat Cost+Cost of
Deviation From Center Line+Path Length.

By way of example, FIG. 2 shows that the total cost from cell A3 is 8, from cell A4 is 5, and from cell A5 is 7. The above-described process is then repeated for rank B to determine from which cells in rank B could the aircraft reach cells A3, A4 and A5 in rank A, based on the respective heading limits at each of those cells in rank A, which will be described in greater detail with reference to FIGS. 3 and 4. Note that the aircraft can reach cell A3 from cell B2, B3 and B4; can reach cell A4 from cell B3 or B4; and can reach cell A5 from cell B4, B5 or B6. The total cost of each of these paths is shown by way of example above the corresponding dashed lines, which represent the possible paths between rank B and rank A.

In addition to computing the total cost for each of the possible paths between rank B and rank A, the computer will add the previously computed costs to fly from connected cells in rank A to second point 25 so as to determine the minimum cost from each of the connected cells in rank B all the way to second point 25. The minimum cost to reach second point 25 from each of the connected cells in rank B is set forth within the corresponding rectangles in FIG. 2. In this manner many of the possible paths between rank B and second point 25 are eliminated so that only the path of minimum cost from each of the connected cells in rank B all the way to second point 25 is saved.

The above-described procedure is repeated again with respect to rank C to determine the possible connections between rank C and rank B. The total cost from each of the connected cells in rank B to second point 25 is then added to the cost computed for each of the connections between rank C and rank B so as to determine the minimum cost from each of the connected cells in rank C all the way to second point 25. The above-described process is repeated as described above for rank D. The optimal aircraft flight path is indicated by the solid line and is determined by the minimum total cost to fly from first point 23 in cell E4 all the way to second point 25. The optimal path passes through cells D5, C5,B5 and A5 and thence to second point 25. The total cost to complete is the summation of the total cost for each of the intermediate paths between adjacent ranks, which by way of example in FIG. 2 is computed to be 24. The orientation of the Cartesian grid is independent of the compass heading of the aircraft. The Y-axis of the grid is always along the straight line connecting adjacent way points. One skilled in the art will appreciate that the dynamic programming technique described above is used to determine the optimal flight path between each pair of adjacent points all the way to the target, working backwards from the target, so that the optimal flight path from the then current position of the aircraft all the way to the target represents a composite of all the individual optimal flight paths between intermediate way points. A separate grid is constructed for each pair of adjacent way points all the way to the target.

Figure 7:
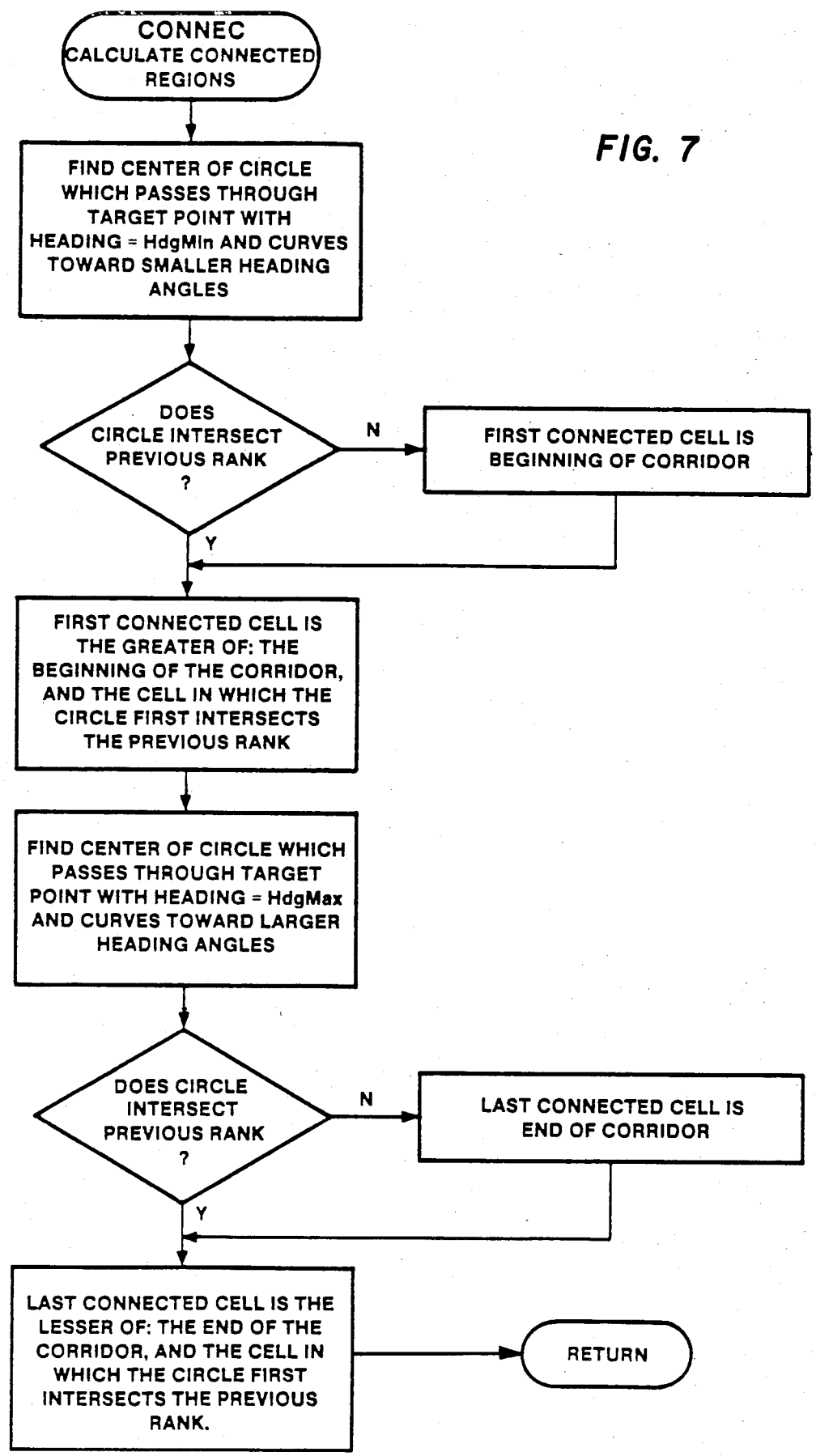

Referring to FIGS. 3 and 7, the algorithm (CONNEC) for determining the "connected" cells in the grid is shown in detail. The preselected minimum and maximum aircraft headings at second point 25 are used to form two imaginary circles having radius R. Radius R is determined as follows:

$$R = V^2/Gmax$$

where V is a aircraft velocity (assumed to be constant during the mission) and Gmax is the preselected maximum lateral acceleration allowed for the aircraft (taking into account physical limitations of the aircraft and pilot).

By way of example, FIG. 3 shows the method for determining the connected cells in rank A. The number of possible positions in rank A from which the aircraft can reach second point 25 depends upon whether and at what point first and second circles 27 and 31 intersect centerline 35 of rank A. Those cells in rank A whose centers lie inside first circle 27 or second circle 31, such that the corresponding circle intersects centerline 35 before reaching those cells would be outside the envelope of possible positions in rank A from which the aircraft could reach second point 25 within the prescribed heading limits using the maximum lateral acceleration. The first connected cell (beginning at the left boundary of the grid) in rank A is that cell in which first circle 27 first intersects centerline 35 and the last connected cell in rank A is that cell in which second circle 31 first intersects centerline 35. If, on the other hand, circles 27 and 31 never intersect centerline 35, the aircraft could reach second point 25 within the prescribed heading limits from any position in rank A, so that the number of possible positions is limited only by the preselected corridor width. One skilled in the art will appreciate that depending upon the prescribed heading limits, one of the two circles may intersect centerline 35 while the other may not. In that case the connected cells are those cels lying between the particular cell in which the corresponding circle intersects centerline 35, on one side of rank A, and the corridor boundary on the opposite side of rank A.

One skilled in the art will also appreciate that the algorithm described above with reference to FIGS. 3 and 7 for determining the connected cells between rank A and second point 25 is also used to determine the possible connections between rank A and rank B, and between rank B and rank C and so on back to first position 23 in the first rank. Minimum and maximum heading limits are determined for each connected cell in rank A, as will be described in greater detail with reference to FIGS. 4 and 9, and are used to determine the possible connections between rank B and rank A. Two circles having radius R and passing through the corresponding minimum and maximum headings at each connected cell in rank A are used to determine the connected cells in rank B in substantailly the same manner as described above. The possible connections between rank B and rank A are determiened for each connected cell in rank A. In this manner all possible connections are examined consistent with the maximum allowed lateral acceleration of the aircraft and the preselected heading limits at second point 25.

Figure 4:
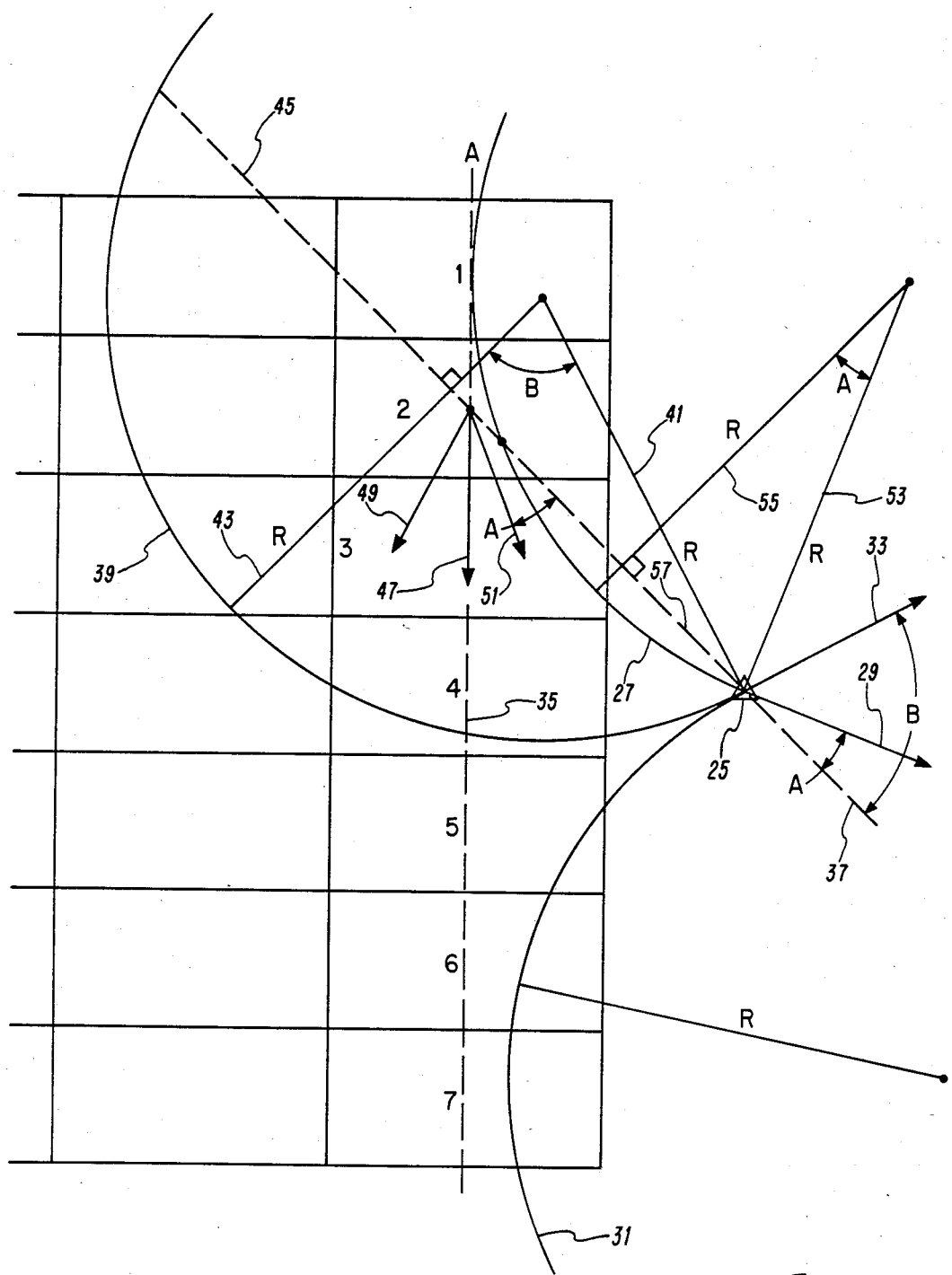
FIG. 4 illustrates the determination of aircraft heading constraints at each possible grid position determined as shown in FIG. 3, according to the present invention.
Figure 9:
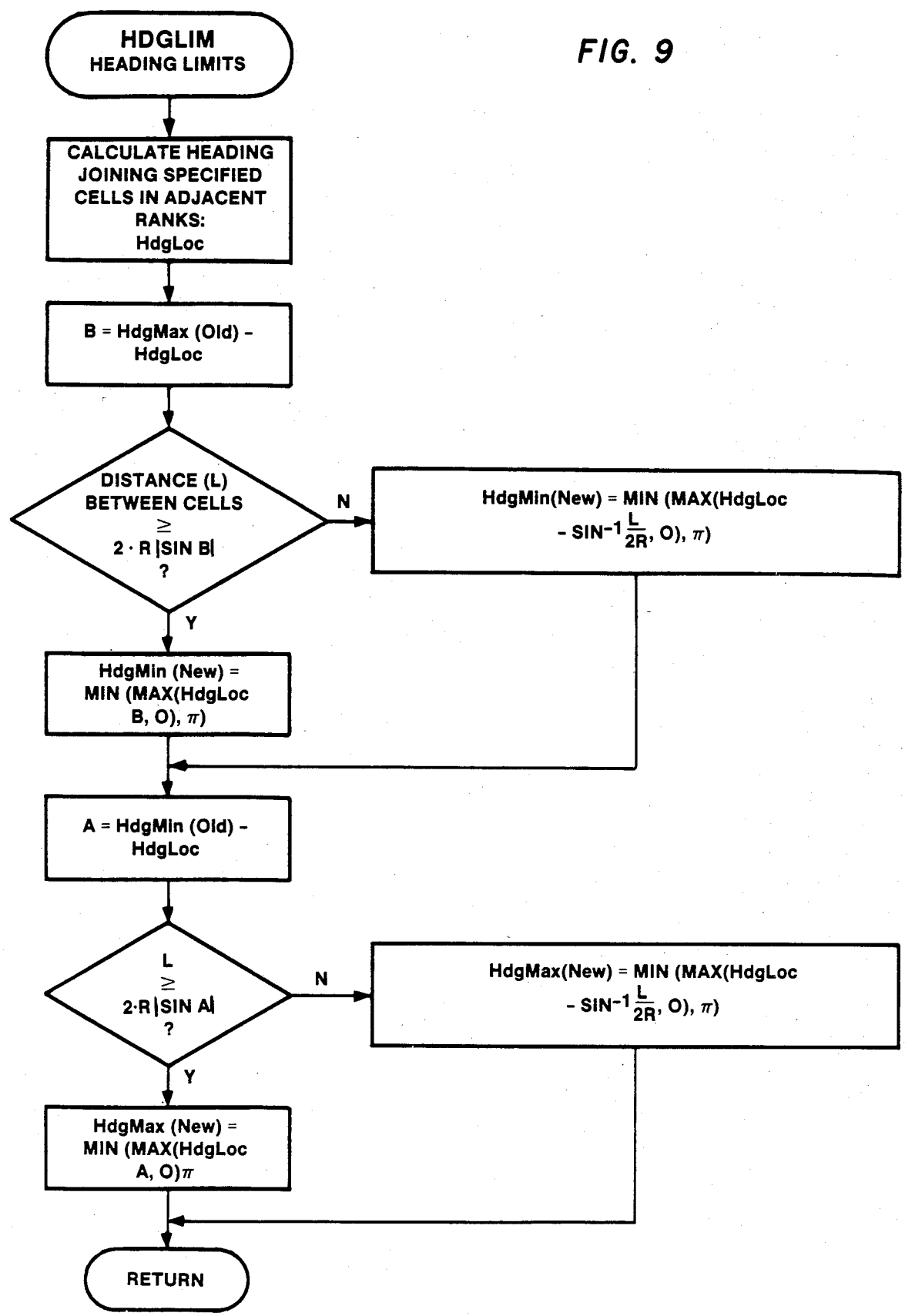

Referring to FIGS. 4 and 9, the algorithm for determining the corresponding minimum and maximum heading limits at each of the connected cells in the grid is shown in detail. By way of example, the determination of minimum and maximum headings will be described with reference to connected cell A2, as shown in FIG. 4. One skilled in the art will recognize that substantially the same method is used to determine the corresponding minimum and maximum headings for the other connected cells in rank A as well as in the other ranks of the grid.

FIG. 9 illustrates the steps of the algorithm (HDGLIM) for determining minimum and maximum headings for each of the connected cells in the grid. The first step is to determine local heading (HdgLoc) 37. Local heading 37 is the heading along a line connecting a specified cell with a target point (e.g., a particular cell in the next rank or second point 25) and is represented in FIG. 4 by the dashed line connecting the center of cell A2 with second point 25, as measured with respect to the "0" heading along the X-axis. Angle B is then computed by subtracting local heading 37 from the previously computed maximum heading (HdgMax (Old)). In the example shown in FIG. 4, the previously computed maximum heading is maximum heading 33 at second point 25.

A circle 39 is formed having a radius R which passes through second point 25 with a heading equal to maximum heading 33 and curves toward smaller heading angles as third circle 39 moves away from second point 25. Within circle 39 angle B is also the angle between radial line 41, which joins the center of circle 39 and second point 25, and radial line 43, which bisects chord 45 of circle 39. Chord 45 lies on the same axis as local heading 37. If the distance (L) between the specified connection points (in this example between cell A2 and second point 25) is greater than or equal to $2R|\sin B|$, the target point (in this example, second point 25) can be reached with a heading equal to the corresponding maximum heading at the target point without exceeding the maximum lateral acceleration. If, on the other hand, the distance (L) is less and $2R|\sin B|$, the target point cannot be reached with a heading equal to the corresponding maximum heading without exceeding the maximum lateral acceleration. In this latter case, the minimum heading at the current cell is determined from acceleration limits.

As shown in FIG. 9, in the first instance where the target cell can be reached with a heading equal to the maximum heading at the target point, the minimum heading at the specified cell HdgMin (New) is equal to the lesser heading as between: (1) the greater of (HdgLoc−B) or "0"; and (2)$\pi$. If, however, the target cell cannot be reached with a heading equal to the maximum heading at the target point without exceeding acceleration limits, the minimum heading at the current cell is equal to the lesser heading as between: (1) the greater of (HdgLoc−arcsin L/2R) or "0"; and (2)$\pi$.

In the example shown in FIG. 4 the distance L is the distance along the dashed line between the center of cell A2 and second point 25. One skilled in the art will recognize that $2R|\sin B|$ is the length of chord 45, which is substantially greater than distance L. Therefore, second point 25 cannot be reached from cell A2 at maximum heading 33 without exceeding acceleration limits. Minimum heading 47 at cell A2 is therefore "0" because (HdgLoc−arcsin L/2R), which is indicated at 49, is less than "0".

The maximum heading 51 at the specified cell (cell A2 in the example illustrated in FIG. 4) is determined in substantially the same manner, except that a different reference angle A is used. Angle A is determined by substracting local heading 37 (HdgLoc) from minimum heading 29 (HdgMin (Old)). Angle A is also the angle between radial line 53, which intersects first circle 27 at second point 25 and radial line 55, which bisects chord 57 of circle 27.

If the distance L between center of cell A2 and second point 25 is greater than or equal to $2R|\sin A|$ (which is equal to the length of chord 57), maximum heading 51 (HdgMax (New)) is equal to the lesser heading as between: (1) the greater of (HdgLoc−A) or "0"; and (2)$\pi$. In such event the target point (e.g., second point 25) can be reached with a heading equal to minimum heading 29 from the specified cell (e.g., cell A2) without exceeding acceleration limits.

If, however, the distance L is less than $2R|\sin A|$, second point 25 cannot be reached with a heading equal to minimum heading 29 without exceeding acceleration limits. In that case maximum heading 51 is equal to the lesser heading as between: (1) the greater of (HdgLoc−arcsin L/2R) or "0"; and (2)$\pi$.

In the example shown in FIG. 4, distance L is greater than $2R|\sin A|$ (i.e., the length of chord 57) so that the second point 25 can be reached from the center of cell A2 with a heading equal to minimum heading 29 at second point 25. Therefore, maximum heading 51 is equal to (HdgLoc−A).

One skilled in the art will recognize that the method described above is used to determine minimum and maximum headings for the connected cells in each rank of the grid, in sequence beginning with the last rank and ending with the second rank (i.e., the rank adjacent to first point 23). In this manner, all possible connected paths are examined consistent with the preselected minimum and maximum headings at second point 25 and the maximum lateral acceleration allowed for the aircraft.

Figure 5A:
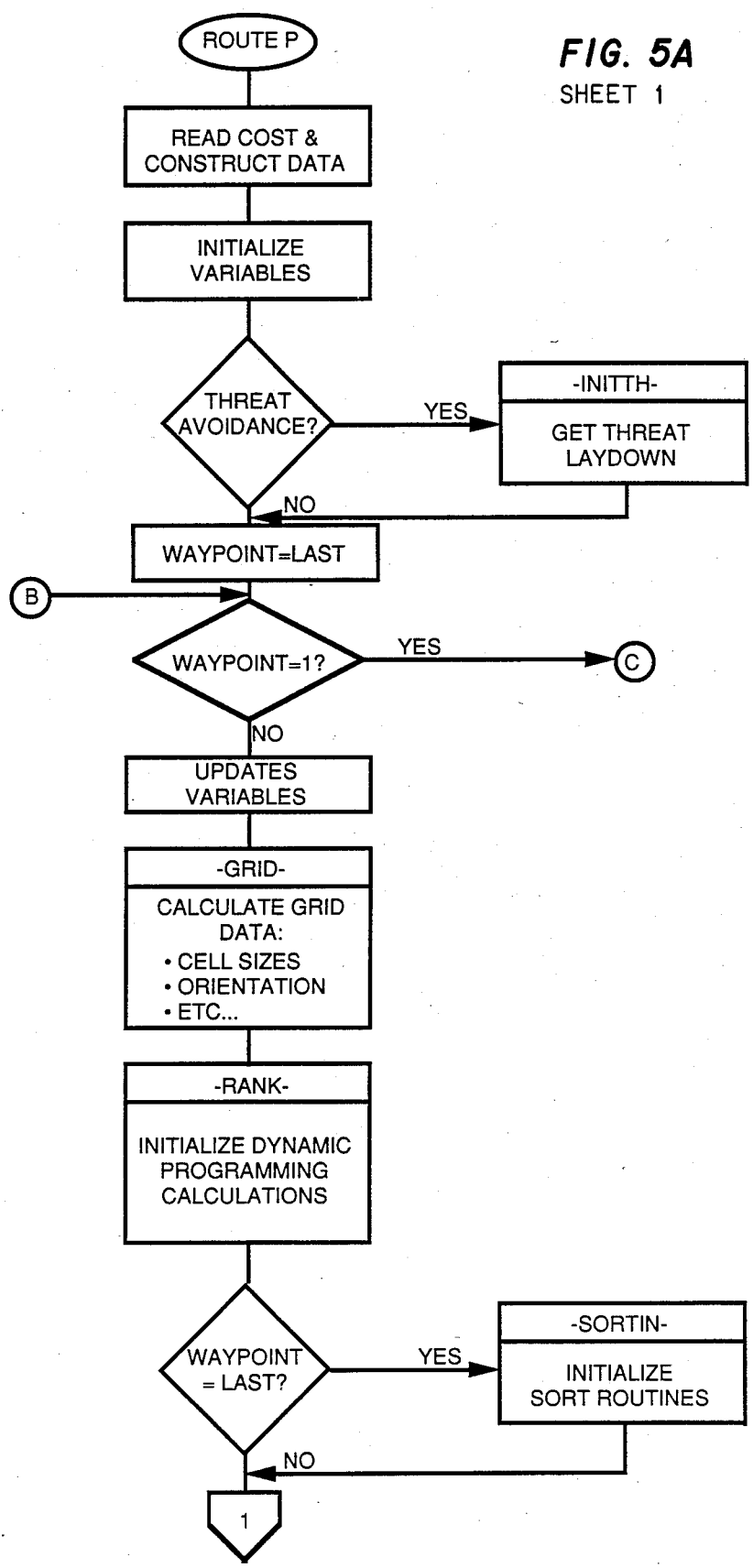
Figure 5A:
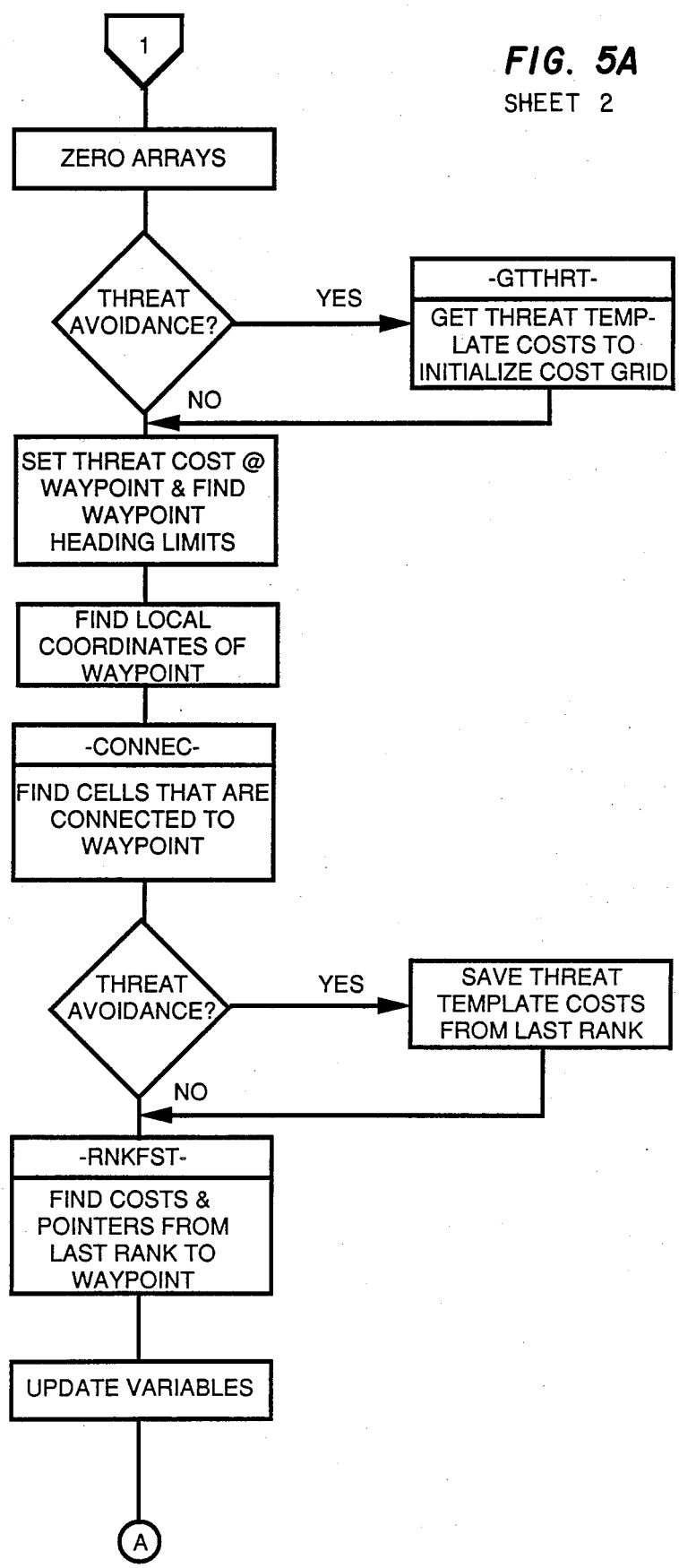
Figure 5B:
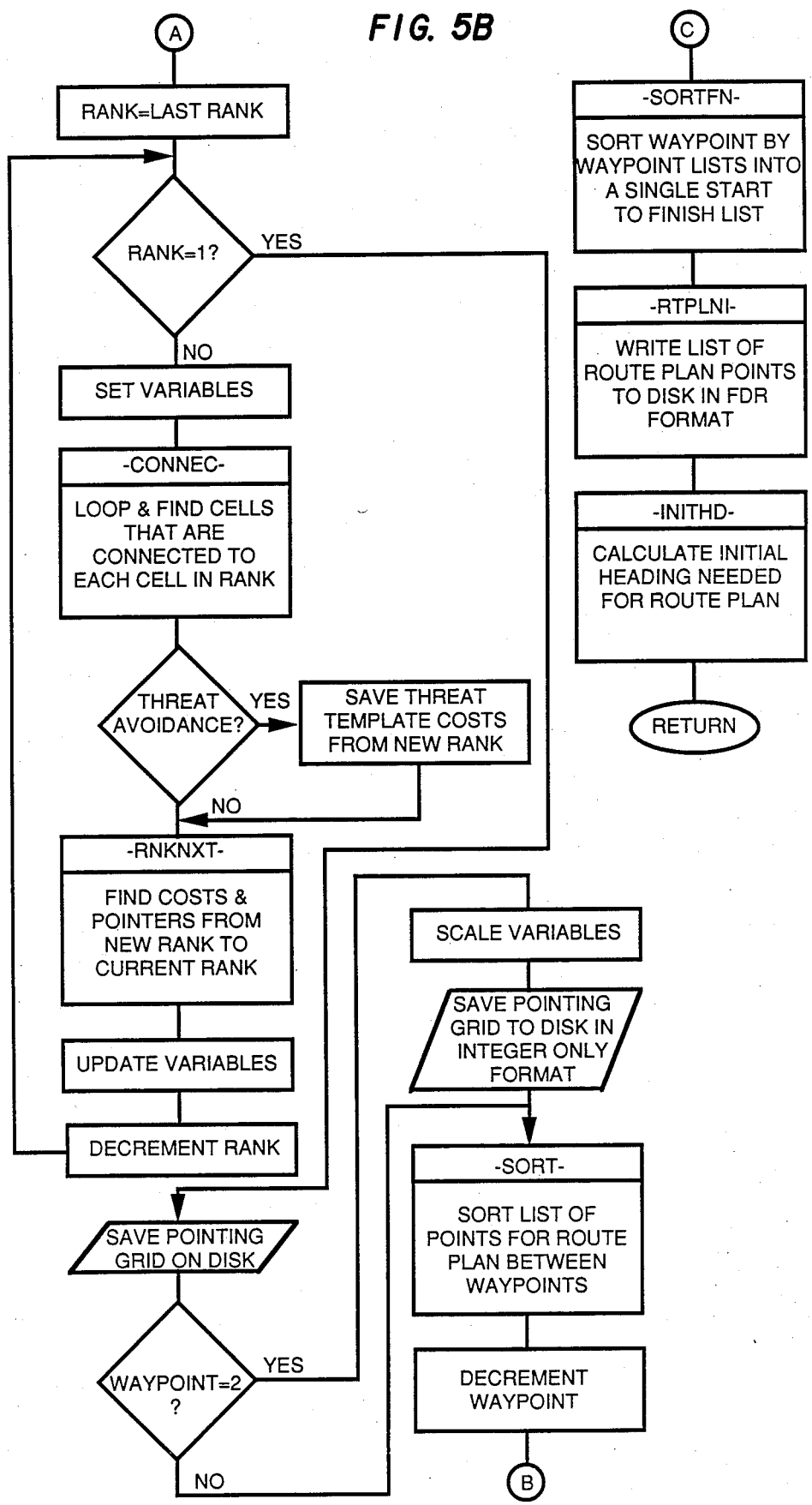
Figure 6:
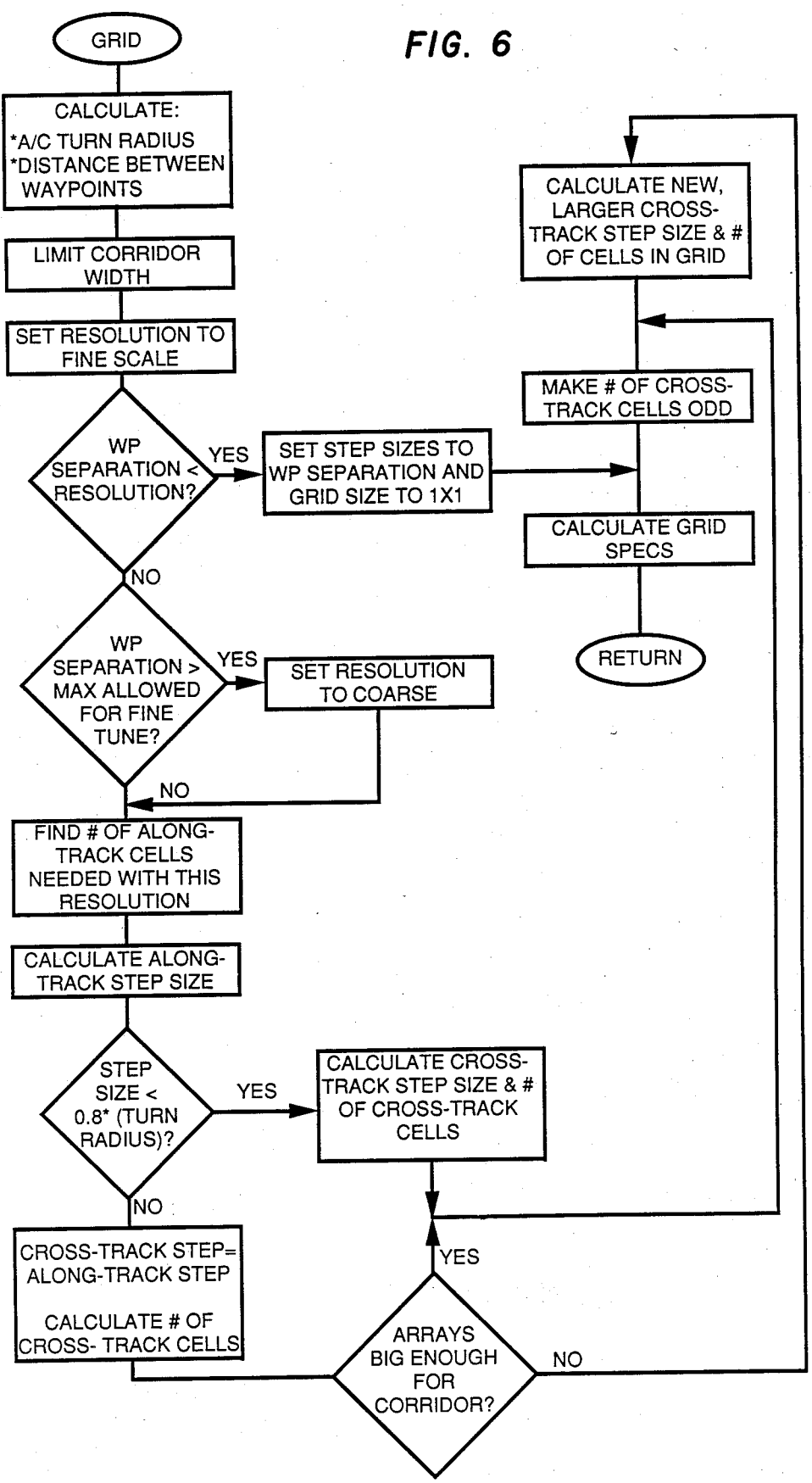

Referring to FIGS. 5A and 5B, the ROUTEP algorithm implements the dynamic programming algorithm described above. Pre-stored cost data (including threat information) and heading constraint information for the aircraft are used to determine optimal paths between successive way points along the way to the target. The orientation of the grid, the cross-track and along-track sizes of the cells, the number of ranks between adjacent way points and the corridor width of the grid are computed. The grid routine is depicted in greater detail in FIG. 6. The heading limits of the aircraft (i.e., the minimum and maximum headings) at the last way point (i.e., the target) are entered.

Figure 8:
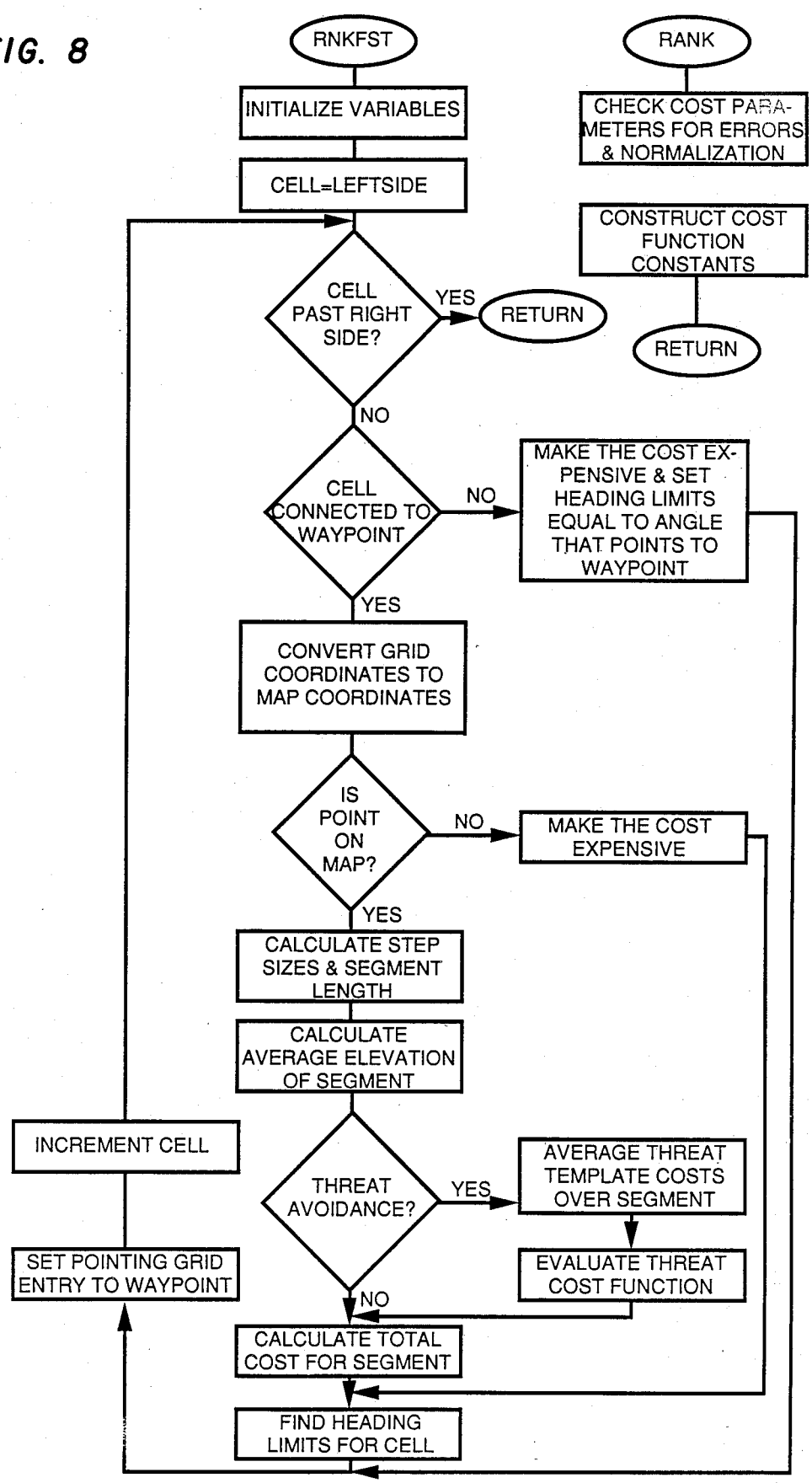

The CONNEC routine, which is described hereinabove with reference to FIG. 7, is used to find the particular cells in the last rank (i.e., the rank adjacent to the target) from which the aircraft can reach the target within the prescribed heading limits. The RNKFST routine (FIGURE 8) is then used to compute the total cost from each of the connected cells in the last rank to the target in sequence from the left side of the grid (i.e., looking toward the target) to the right side of the grid. The HDGLIM routine (FIG. 9) is then used to determine the minimum and maximum heading limits from each of the connected cells in the last rank to reach the target within the heading limits specified at the target, as described hereinabove.

The CONNEC routine, as depicted in FIG. 7, is then used again to determine from which cells in the penultimate rank the aircraft could reach those cells in the last rank which are previously determined to be connected cells, within the heading limits determined for each of the connected cells in the last rank. The RNKNXT routine, as depicted in FIG. 10, is used to find the total cost of each of the possible connections from the cells in the penultimate rank to the connected cells in the last rank in sequence from the left boundary to the right boundary within the penultimate rank. The previously determined cost from each of the connected cells in the last rank to the target is then added to the cost determined for each of the possible connections between the penultimate rank and the last rank to determine the cumulative cost from each of the connected cells in the penultimate rank to the target. The respective paths having the minimum cumulative cost from each of the connected cells in the penultimate rank to the target are then saved and stored as possible segments of the optimal route.

The HDGLIM routine (FIG. 9) is then used to determine the corresponding minimum and maximum heading limits for each of the connected cells in the penultimate rank. The minimum and maximum heading limits represent a range of headings from which the aircraft can reach the particular cell in the last rank which lies on the minimum cost path between the corresponding cell in the penultimate rank and the target, within the heading limits for the particular cell in the last rank without exceeding maximum lateral acceleration.

The aforementioned process is performed as described above with respect to the connected cells in each rank in sequence from the last rank to the first rank (in which the penultimate way point is located). An optimal path is selected from each of the connected cells in the first rank all the way to the target. The optimal path is the path of minimum cost from the corresponding connected cell to the target.

Figure 11:
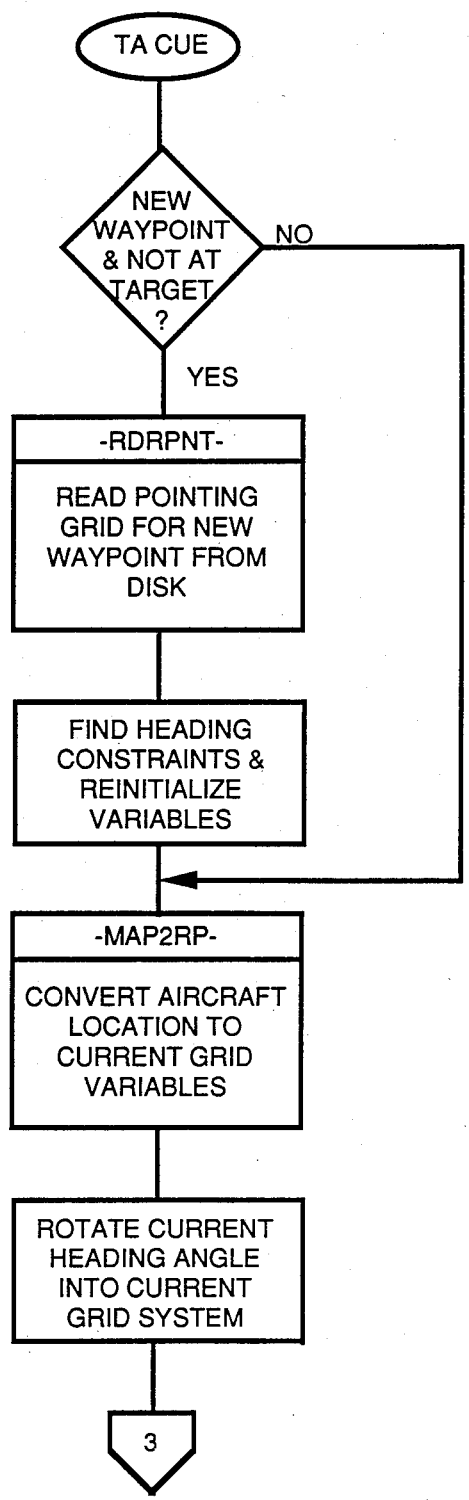
Figure 11:
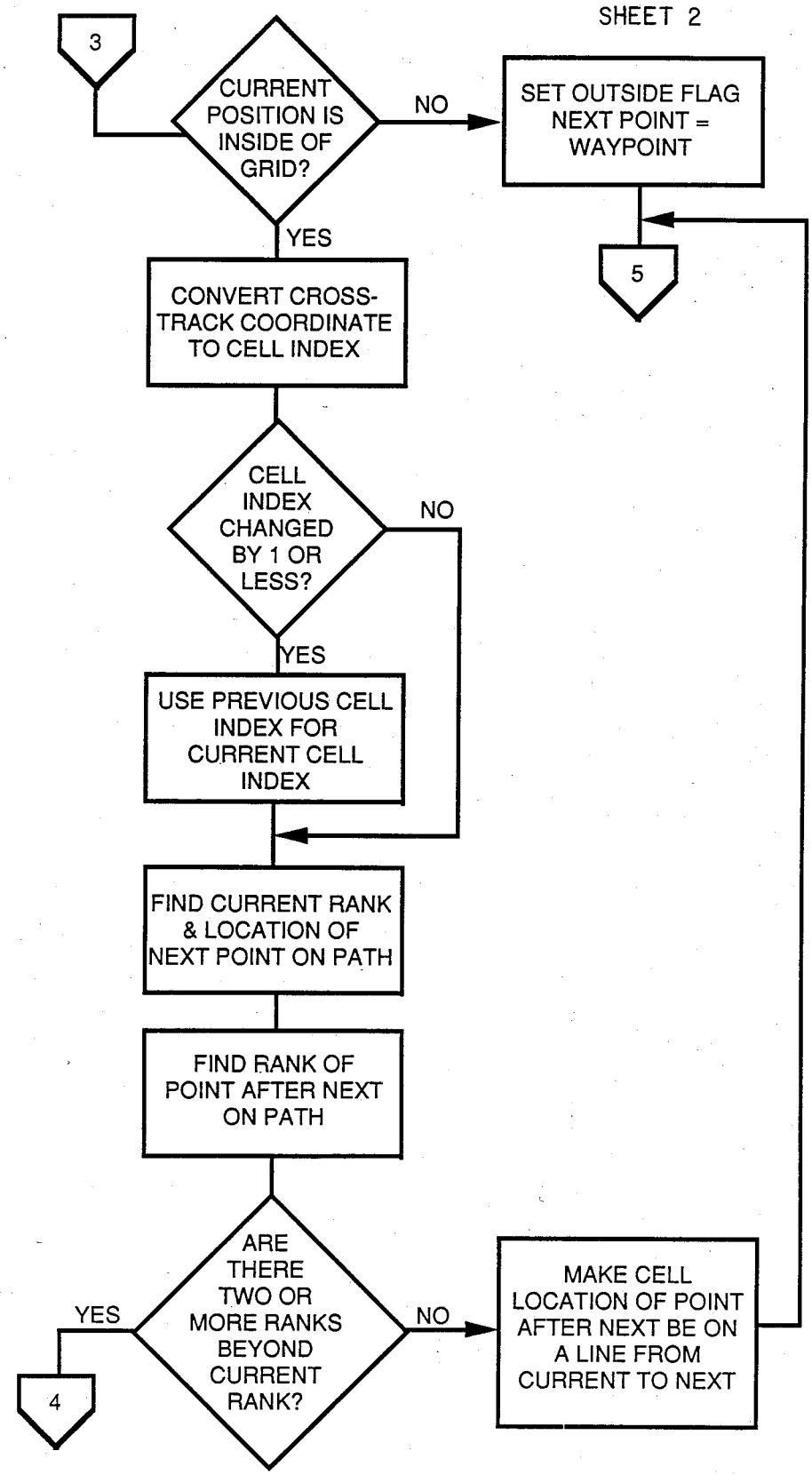
Figure 11:
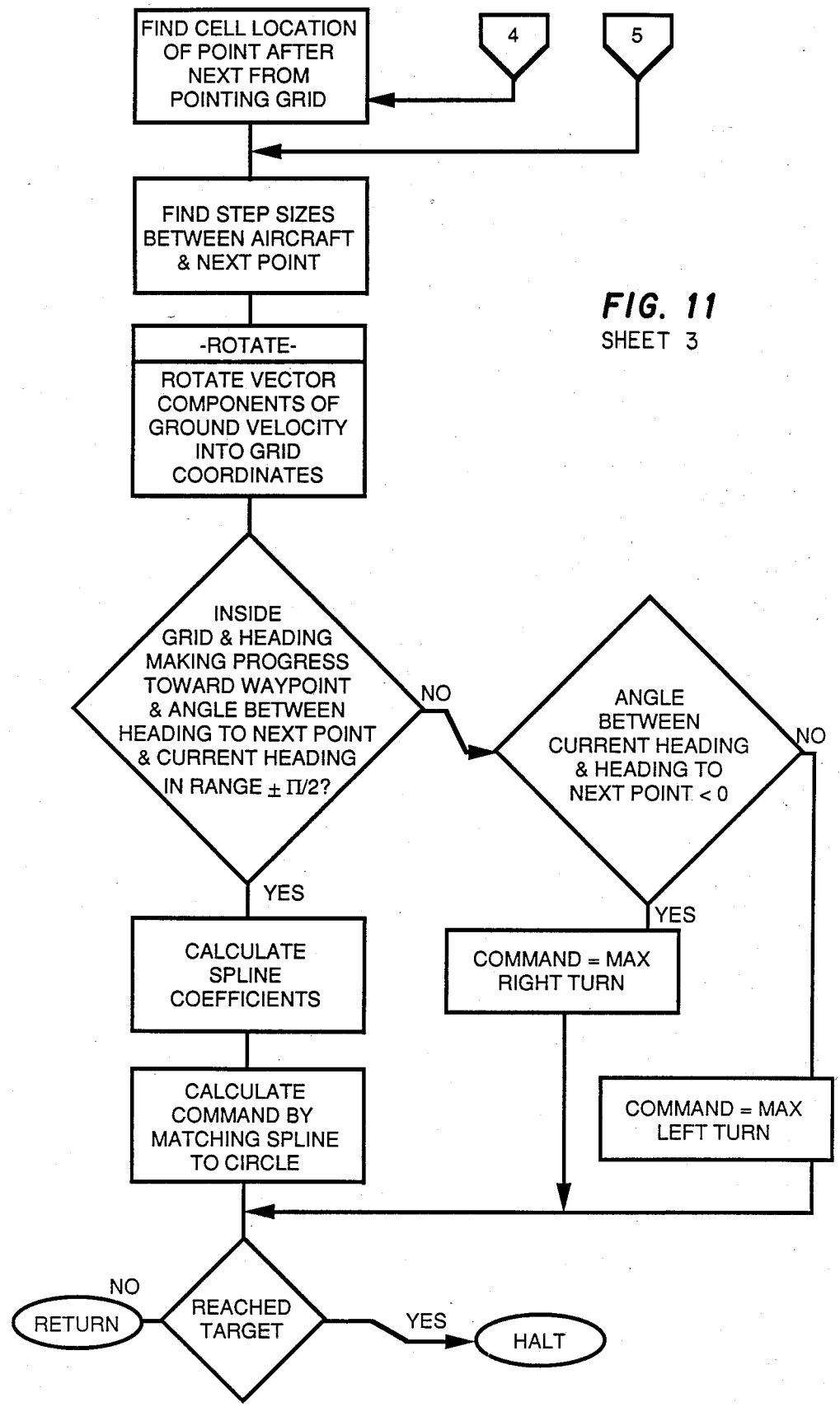

The foregoing process is then repeated, working backward from the penultimate way point (using the heading limits previously calculated for that way point) to the next way point uprange and so on, so that an optimal route path can be constructed backwards from the target to the then current aircraft position. The optimal route computed using the ROUTEP algorithm is converted into a series of corresponding aircraft headings, which are used as inputs to a TACUE routine for controlling the lateral acceleration of the aircraft using a conventional cubic spline equation, as depicted in greater detail in FIG. 11.

Various embodiments of the invention have now been described in detail. Since it it obvious that many changes in and additions to the above-described preferred embodiment may be made without departing from the nature, spirit and scope of the present invention, the invention is not to be limited to said details, except as set forth in the appended claims.

What is claimed is:

1. A system for determining an optimal path for an aircraft to fly from position to a second position so that the aircraft heading at the second position is within preselected minimum and maximum heading limits, said system comprising:

means for constructing a reference grid, the length of which is oriented along a first axis connecting said first and second positions so that said first axis corresponds to the centerline of the grid and the width of which corresponds to a preselected width along a second axis which is perpendicular to said first axis, said grid being divided into N number of ranks in succession between said first and second positions, said first position being at the center of the first rank and said second position being adjacent to the center of the Nth rank, each of said ranks spanning the entire width of said grid and being divided into a predetermined number of rectangular cells;

means for determining connected cells in said Nth rank, the connected cells in the Nth rank being those cells from which the aircraft can reach said second position within the preselected minimum and maximum heading limits without exceeding the maximum lateral acceleration allowed for the aircraft;

means for determining the cost of flying from each of the connected cells in the Nth rank to said second position based on a preselected cost function;

means for determining corresponding minimum and maximum heading limits at each of the connected cells in the Nth rank, said minimum and maximum heading limits representing a range of allowed headings for the aircraft at the corresponding connected cell which will enable the aircraft to reach the second position within the preselected minimum and maximum heading limits without exceeding the maximum lateral acceleration;

means for determining connected paths between each pair of adjacent ranks $(i-1)$ and $i$ in sequence beginning with $i=N$ and ending with $i=2$, each of said connected paths representing a discrete connection between a specified cell in the $(i-1)$th rank and a specified connected cell in the ith rank whereby the aircraft can reach the specified cell in the ith rank within the corresponding heading limits from the specified cell in the $(i-1)$th rank without exceeding the maximum lateral acceleration, each of the cells in the $(i-1)$th rank from which the aircraft can reach at least one of the connected cells in the ith rank within the corresponding heading limits without exceeding the maximum lateral acceleration being a connected cell in the $(i-1)$th rank;

means for determining the cost of flying from the $(i-1)$th rank to the ith rank along each of said connected paths and for determining the minimum cost of flying from each of the connected cells in the $(i-1)$th rank to said second position based on a preselected cost function for each rank in sequence beginning with $i=N$ and ending with $i=2$;

means for storing the corresponding path of minimum cost between each connected cell in the $(i-1)$th rank and the second position and the corresponding cost of said minimum cost path for each of the connected cells in the $(i-1)$th rank, for each rank in sequence beginning with $i=N$ and ending with $i=2$;

means for determining corresponding minimum and maximum heading limits for each of the connected cells in the $(i-1)$th rank, for each rank in sequence beginning with $i=N$ and ending with $i=2$, said heading limits representing a range of allowed headings for the aircraft at the corresponding connected cell in the $(i-1)$th rank which will enable the aircraft to reach a particular one of the connected cells in the ith rank within the corresponding heading limits without exceeding the maximum lateral acceleration, said particular connected cell in the ith rank being that cell which lies on the path of minimum cost between the corresponding connected cell in the $(i-1)$th rank and the second position;

means for determining particular ones of the connected cells in the second rank which the aircraft can reach from said first position within the corresponding heading limits without exceeding the maximum lateral acceleration;

means for determining the cost of flying from said first position to each of said particular connected cells and for determining the path of minimum cost of flying from said first position to said second position, said minimum cost path being the optimal flight path for the aircraft between said first and second positions; and means for determining corresponding minimum and maximum heading limits at the first position, said heading limits representing a range of allowed headings for the aircraft at the first position which will enable the aircraft to reach the particular connected cell in the second rank which lies on the path of minimum cost between the first and second positions.

2. The system according to claim 1 further including means for converting said optimal flight path between said first and second positions into a series of corresponding headings for the aircraft o fly between adjacent ranks in the grid and for controlling said aircraft to fly at the corresponding heading between each pair of adjacent ranks from the first rank to the Nth rank and from the Nth to the second position.

3. The system according to claim 2 wherein said preselected cost function includes cost parameters relating to threat avoidance and terrain avoidance, each of the connected paths between adjacent ranks having predetermined cost parameters assigned thereto, the total cost of each of said connected paths being the sum total of the corresponding cost parameters assigned thereto.

4. The system according to claim 1 wherein each of said ranks has M number of cells, where M is an odd integer, so that the center of each rank is at the center of the corresponding middle cell.

5. A method for determining the optimal path for an aircraft to fly from a first position to a second position so that the aircraft heading at the second position is within preselected minimum and maximum heading limits, said method comprising the steps of:
  constructing a referecne grid, the length of which is oriented along a first axis connecting said first and second positions so that the first axis corresponds to the centerline of the grid and the width of which corresponds to a preselected width along a second axis which is perpendicular to said first axis, said grid being divided into N number of ranks in succession between said first and second positions, said first position being at the center of the first rank and said second position being adjacent to the center of the Nth rank, each of said ranks spanning the entire width of said grid and being divided into a predetermined number of rectangular cells;
  determining connected cells in said Nth rank, the connected cells in the Nth rank being those cells from which the aircraft can reach said second position within the preselected minimum and maximum heading limits without exceeding the maximum lateral acceleration allowed for the aircraft;
  determining the cost of flying from each of the conenected cells in the Nth rank to said second position based on a preselected cost function;
  determining the corresponding heading limits at each of the connected cells in the Nth rank, said heading limits representing a range of allowed headings for the aircraft at the corresponding connected cell in the Nth rank from which the aircraft can reach the second position within the preselected minimum and maximum heading limits; and
  performing the following steps for each pair of adjacent ranks in sequence beginning with i=N and ending with i=2;
    determining connected paths between each pair of adjacent ranks (i−1) and i, each of said connected paths representing a discrete connection between a specified cell in the (i−1)th rank and a specified connected cell in the ith rank whereby the aircraft can reach the specified cell in the ith rank within the corresponding heading limits from the specified cell in the (i−1)th rank without exceeding the maximum lateral acceleration, each of the cells in the (i−1)th rank from which the aircraft can reach at least one of the connected cells in the ith rank within the corresponding heading limits without exceeding the maximum lateral acceleration being a connected cell in the (i−1)th rank;
    determining the cost of flying from the (i−1)th rank to the ith rank along each of said connected paths and determining the minimum cost of flying from each of the connected cells in the (i−1)th rank to said second position based on the preselected cost function;
    storing the corresponding path of minimum cost between each connected cell in the (i−1)th rank and the second position and the corresponding cost of said minimum cost path for each of the connected cells in the (i−1)th rank; and
    determining corresponding minimum and maximum heading limits for each of the connected cells in the (i−1)th rank, said heading limits representing a range of allowed headings for the aircraft at the corresponding connected cell in the (i−1)th rank which will enable the aircraft to reach a particular one of the connected cells in the ith rank with the corresponding heading limits without exceeding the maximum lateral acceleration, said particular connected cell in the ith rank being that cell which lies on the path of minimum cost between the corresponding connected cell in the (i−1)th rank and the second position.

6. The method according to claim 5 wherein the connected cells in each of the ranks, beginning with the Nth rank and ending with the first rank, are determined according to the following steps:
  forming a first circle of radius R equal to $V^2/G_{max}$ where V is the aircraft velocity and $G_{max}$ is the maximum lateral acceleration of the aircraft, said first circle passing through a target point at the corresponding minimum heading limit and curving towards smaller headings as said first circle moves away from the target point, said headings being measured with respect to a first portion of said second axis extending from the centerline of the grid toward the right boundary thereof, as viewed from said first position towards said second position, so that the smallest possible heading is along said first portion of said second axis and the largest possible heading is along a second portion of said second axis, opposite from said first portion, which extends from the centerline of the grid to the left boundary thereof, as viewed from said first position toward said second position;
  determining the particular cells in a first portion of a particular rank, lying between the left boundary of the particular rank and a middle cell whose center is on the first axis, from which the aircraft can reach the target point within the corresponding minimum and maximum heading limits without exceeding the maximum lateral acceleration, those cells in said first portion of the particular rank whose centers are on or outside the perimeter of said first circle being connected cells from which said aircraft can reach said target point within the corresponding heading limits;
  forming a second circle of radius R passing through said target point at the corresponding maximum heading and curving toward larger heading angles as said second circle moves away from said target point; and determining the particular cells in a second portion of the particular rank, lying between said middle cell and the right boundary of the particular rank, from which the aircraft can reach the target point within the corresponding minimum and maximum heading limits without exceeding the maximum lateral acceleration, those cells in said second portion of the particular rank whose centers are on or outside the perimeter of said second circle being connected cells from which the aircraft can reach said target point within the corresponding heading limits.

7. The method according to claim 6 wherein the step of determining the respective minimum and maximum heading limits of each of the connected cells in each rank in sequence beginning with the Nth rank and ending with the first rank is comprised of the following sub-steps:

determining a first angle (B) representing the difference between the corresponding maximum heading at the target point and a local heading along an axis connecting a corresponding one of the connected cells in the particular rank to the target point;

comparing a first distance (L) between the center of the corresponding cell and the target point with the second distance equal to $2R|\sin B|$ and for generating a first signal if L is greater than or equal to $2R|\sin B|$ and alternatively for generating a second signal if L is less than $2R|\sin B|$:

in response to said first electrical signal, determining a first heading which is the greater heading as between (1) a heading equal to said local heading minus said first angle (B) and (2) said smallest possible heading and comparing said first heading determined above with said largest possible heading, the minimum heading at the corresponding connected cell being equal to the smaller of said first heading and said largest possible heading;

in response to second electrical signal, determining a second heading which is the greater heading as between (1) a heading equal to said local heading minus a second angle equal to $\arcsin L/2R$ and (2) said smallest possible heading and comparing the second heading determined above with said largest possible heading, the minimum heading at the corresponding connected cell being equal to the smaller of said second heading and said largest possible heading:

determining a third angle (A) representing the difference between the corresponding minimum heading at the target point and said local heading;

comparing the first distance (L) with a third distance equal $2R|\sin A|$ and generating a third electrical signal if L is greater than or equal to $2R|\text{in}A|$ and alternatively generating a fourth electrical signal if L is less than $2R|\sin A|$;

in response to said third electrical signal, determining a third heading which is the greater heading as between (1) a heading equal to said local heading minus said third angle (A) and (2) said smallest possible heading and comparing said third heading with said largest possible heading, the maximum heading at the corresponding connected cell being equal to the smaller of said third heading and said largest possible heading; and in response to said fourth electrical signal determining a fourth heading which is the greater heading as between (1) a heading equal to said local heading minus said second angle ($\arcsin L/2R$) and (2) said smallest possible heading and comparing said fourth heading with said largest possible heading, the maximum heading at the corresponding connected cell being equal to the smaller of said fourth heading and said largest possible heading.

8. The method according to claim 7 wherein said target point is said second position and said particular rank is said Nth rank.

9. The method according to claim 7 wherein said target point is a specified connected cell in the ith rank and said particular rank corresponds to the (i−1)th rank.

10. The method according to claim 5 further including the step of converting said optimal flight path between said first and second positions into a series of corresponding headings for the aircraft to fly between adjacent ranks in the grid and controlling said aircraft to fly at the corresponding heading between each pair of adjacent ranks from the first rank to the Nth rank and from the Nth rank to the second position.

* * * * *